United States Patent [19]
Leon et al.

[11] Patent Number: 5,519,300
[45] Date of Patent: May 21, 1996

[54] METHOD AND APPARATUS FOR ANALYSIS OF POLYPHASE ELECTRICAL MOTOR SYSTEMS

[75] Inventors: Robert L. Leon, Maple Glen; Martin J. Dowling, Norristown; David Q. Heagerty, Glen Mills, all of Pa.

[73] Assignee: Liberty Technologies, Inc., Conshohocken, Pa.

[21] Appl. No.: 84,691

[22] Filed: Jun. 29, 1993

[51] Int. Cl.⁶ .................... H02P 6/00; G01L 3/00
[52] U.S. Cl. ...................... 318/729; 324/76.11
[58] Field of Search .................. 318/721, 552, 318/729, 798–815, 432; 324/158 MG, 500, 76.41, 76.44, 76.52, 76.53, 76.68, 76, 77, 86; 323/210, 307; 73/862.27, 862.326, 862.193

[56] References Cited

U.S. PATENT DOCUMENTS

| | | | |
|---|---|---|---|
| 3,584,276 | 6/1971 | Ringland et al. | 318/721 |
| 3,728,535 | 4/1973 | Dickman et al. | 318/562 X |
| 4,356,440 | 10/1982 | Curtiss et al. | 323/210 |
| 4,356,443 | 10/1982 | Emery | 324/51 |
| 4,851,766 | 7/1989 | Shiobara et al. | 324/158 MG |
| 4,949,362 | 8/1990 | Gaubatz | 361/48 X |
| 4,978,909 | 12/1990 | Hendrix et al. | 324/77 B |
| 5,190,185 | 4/1992 | Ball | 323/307 |

FOREIGN PATENT DOCUMENTS

| | | |
|---|---|---|
| 58-139662 | 11/1983 | Japan. |
| 2168497 | 6/1986 | United Kingdom. |
| WO91 07644 | 5/1991 | WIPO. |

Primary Examiner—Jonathan Wysocki
Attorney, Agent, or Firm—Panitch Schwarze Jacobs & Nadel

[57] ABSTRACT

A method for determining at least one operating parameter to determine the operating condition of a polyphase electric motor system comprises sensing the instantaneous current signal and the instantaneous voltage signal as a function of time for more than one electrical phase of the motor. The sensed current signals and the sensed voltage signals are both amplitude demodulated and phase demodulated to provide amplitude demodulated current and voltage signals as a function of time and phase demodulated current and voltage signals as a function of time. The resulting amplitude and phase demodulated signals are used to determine one or more of the following electrical parameters as a function of time: total real power, real power per phase, total reactive power, reactive power per phase, total apparent power, apparent power per phase, overall power factor, power factor per phase, electrical impedance per phase, and electrical balance.

25 Claims, 6 Drawing Sheets

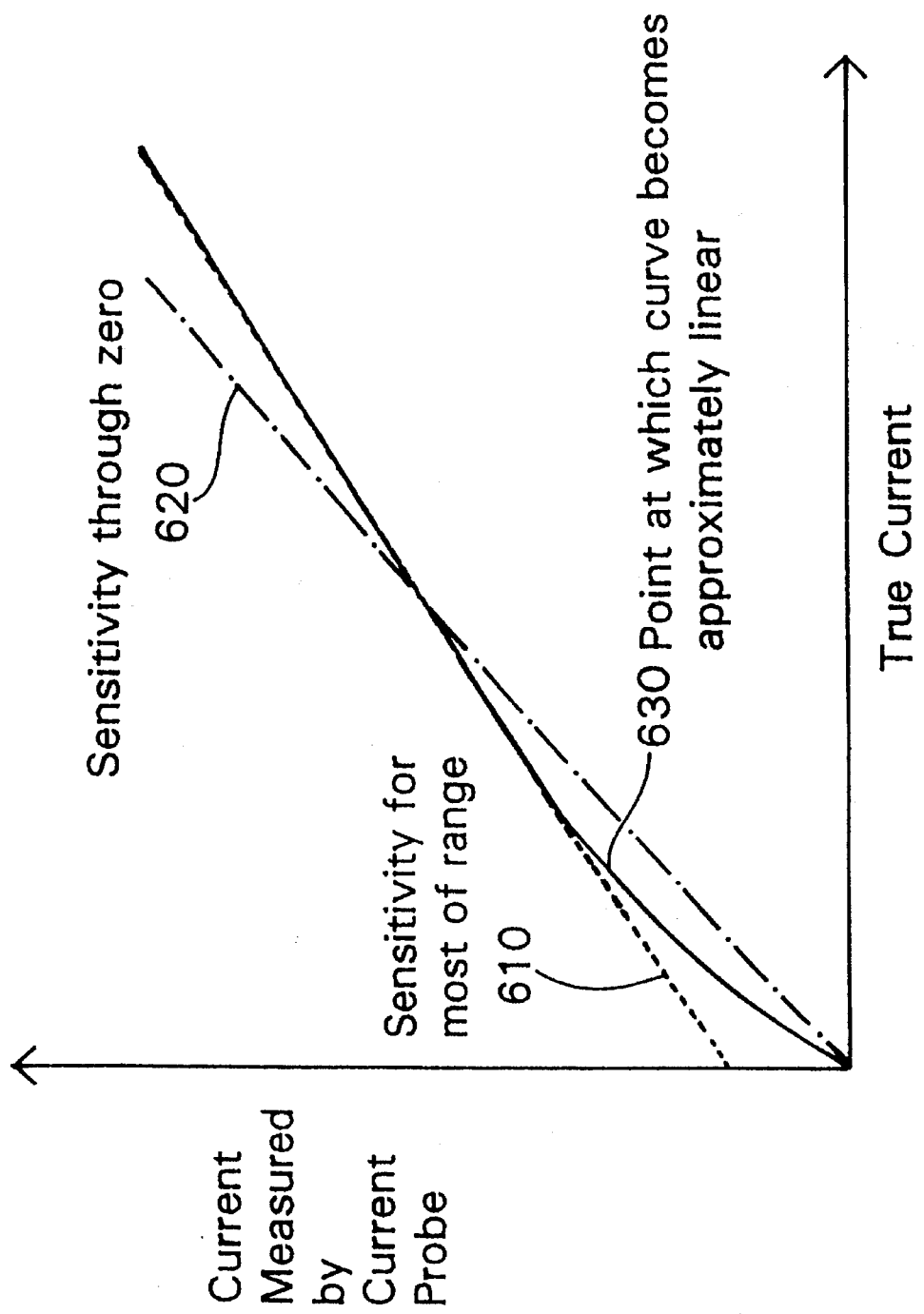

METHOD AND APPARATUS FOR ANALYSIS OF POLYPHASE ELECTRICAL MOTOR SYSTEMS

FIELD OF THE INVENTION

The present invention pertains to the measurement and analysis of the currents, voltages, power factors, and powers (real, reactive, and apparent), of polyphase motor systems and more particularly to an improved method and apparatus for enhancing the accuracy and usefulness of these measurements, often in conjunction with concurrent mechanical measurements, enabling problems with the motors and the equipment they drive to be diagnosed more definitively so that repairs can be limited to only what requires repair.

BACKGROUND OF THE INVENTION

Motors, particularly electrical motors, play a key role in industry. Such motors are used to drive fans, pumps, compressors, valves, and many other machines. It is potentially very costly to allow a significant problem to go on unnoticed in either the motor or the motor driven machine. It is also costly and very time consuming to attempt to repair a nonexistent problem. With present less definitive methods, these costly situations often occur. Thus there is a need for an improved diagnostic method and apparatus as described in the invention for use with motors and motor driven machines.

Present conventional techniques have been developed to monitor such motor systems. One such commonly used conventional technique involves analyzing the signature developed from a single motor current probe in order to ascertain motor fault conditions. However, there are shortcomings associated with this and other standard motor monitoring techniques which prevent optimal motor analysis.

A first problem with conventional current probe technology for motor system analysis is that current and voltage envelopes are generally estimated using inexact demodulation techniques such as rms to D.C. conversion or rectification, followed by low-pass filtering. These signal processing methods exhibit a slow response to rapidly changing current or voltage signals since they rely heavily on low-pass filtering. This reliance results in an inaccurate response to highly dynamic current features such as inrush current.

A second problem with such conventional technology for motor analysis is non-linearity in the current probes, especially at the lower part of their detection range. This problem is often dealt with by specifying a lesser accuracy at low currents, changing the specification from percent reading to percent full scale, or simply not specifying the accuracy over a portion of the detection range.

A third problem with such conventional technology is the distorting influence of filters, non-simultaneous analog-to-digital converter sampling, and other hardware-induced signal processing errors in which the true phase relation between measurement channels is impaired.

A fourth shortcoming of some conventional methods is the need to take the motor off-line in order to ascertain resistive and inductive imbalance. This is a great inconvenience when dealing with continuous-duty motors. In addition, the off-line measurements may not be truly representative of the on-line resistive or inductive balance, since operational stresses may significantly change the state of balance.

A fifth shortcoming with present conventional technology is the exclusive reliance on electrical measurements alone to monitor and diagnose all problems in such motor systems. A motor is not just electrical; it is an electromechanical device, encompassing as well the mechanical aspects of the driven machine, and analyzing either the electrical or the mechanical aspects in isolation ignores important monitoring and diagnostic information.

The present invention overcomes many of the problems of present conventional monitoring techniques by providing a method and apparatus which improves the quality of voltage/current envelope estimation by utilizing an analytic signal approach in which the signal is uniquely defined in terms of quadrature components, and to do so for polyphase motors so that the estimation of polyphase variables such as motor power is improved as well as that of parameters primarily associated with individual phases, such as voltage and current. The present method and apparatus overcomes the non-linear effects of a current probe by modeling the true probe response in software, estimating the model parameters using actual calibration data, and subsequently correcting all measured current values utilizing the model. The present method and apparatus also overcomes the effect of sampling skew and other measurement channel time delay effects by accurately estimating channel-to-channel phase delays using an analytic signal approach in which quadrature components are used to calculate the instantaneous phases of the multi-channel signals, and the instantaneous values are statistically combined to yield accurate cross-channel phase corrections. In addition, the present method and apparatus provides a measure of inphase and reactive imbalance during operation by comparing the voltage and current phasors. Finally, the present method and apparatus enhances the monitoring and diagnostic capability of motor monitoring techniques by simultaneously measuring electrical and mechanical variables, using both types of variables together to more definitively diagnose the existence of certain faults, some of which both types of measurements are sensitive to, and some of which only electrical or only mechanical measurements are sensitive to.

SUMMARY OF THE INVENTION

Briefly stated, the present invention comprises a method and apparatus for determining at least one operating parameter to determine the operating condition of a polyphase electric motor system. The method comprises the steps of sensing the instantaneous current signal as a function of time for more than one electrical phase of the motor. The instantaneous voltage signal is also sensed as a function of time for more than one electrical phase of the motor. The sensed current signals and the sensed voltage signals are amplitude demodulated to provide an amplitude demodulated current signal as a function of time and an amplitude demodulated voltage signal as a function of time for more than one electrical phase. The sensed current and sensed voltage signals are also phase demodulated to provide a phase demodulated current signal as a function of time and a phase demodulated voltage signal as a function of time for more than one electrical phase. The amplitude demodulated current and voltage signals and the phase demodulated current and voltage signals are used to determine at least one electrical motor operating parameter as a function of time from the group consisting of total real power, real power per phase, total reactive power, reactive power per phase, total apparent power, apparent power per phase, overall power factor, power factor per phase, electrical impedance per phase, and electrical balance.

BRIEF DESCRIPTION OF THE DRAWINGS

The foregoing summary, as well as the following detailed description of a preferred embodiment of the invention, will be better understood when read in conjunction with the appended drawings. For the purpose of illustrating the invention, there is shown in the drawings an embodiment which is presently preferred. It should be understood, however, that the invention is not limited to the precise arrangements and instrumentalities shown. In the drawings:

FIG. 6 is a graphic illustration of the linearity aspects of typical current probes.

DETAILED DESCRIPTION OF PREFERRED EMBODIMENT

Figure 1:
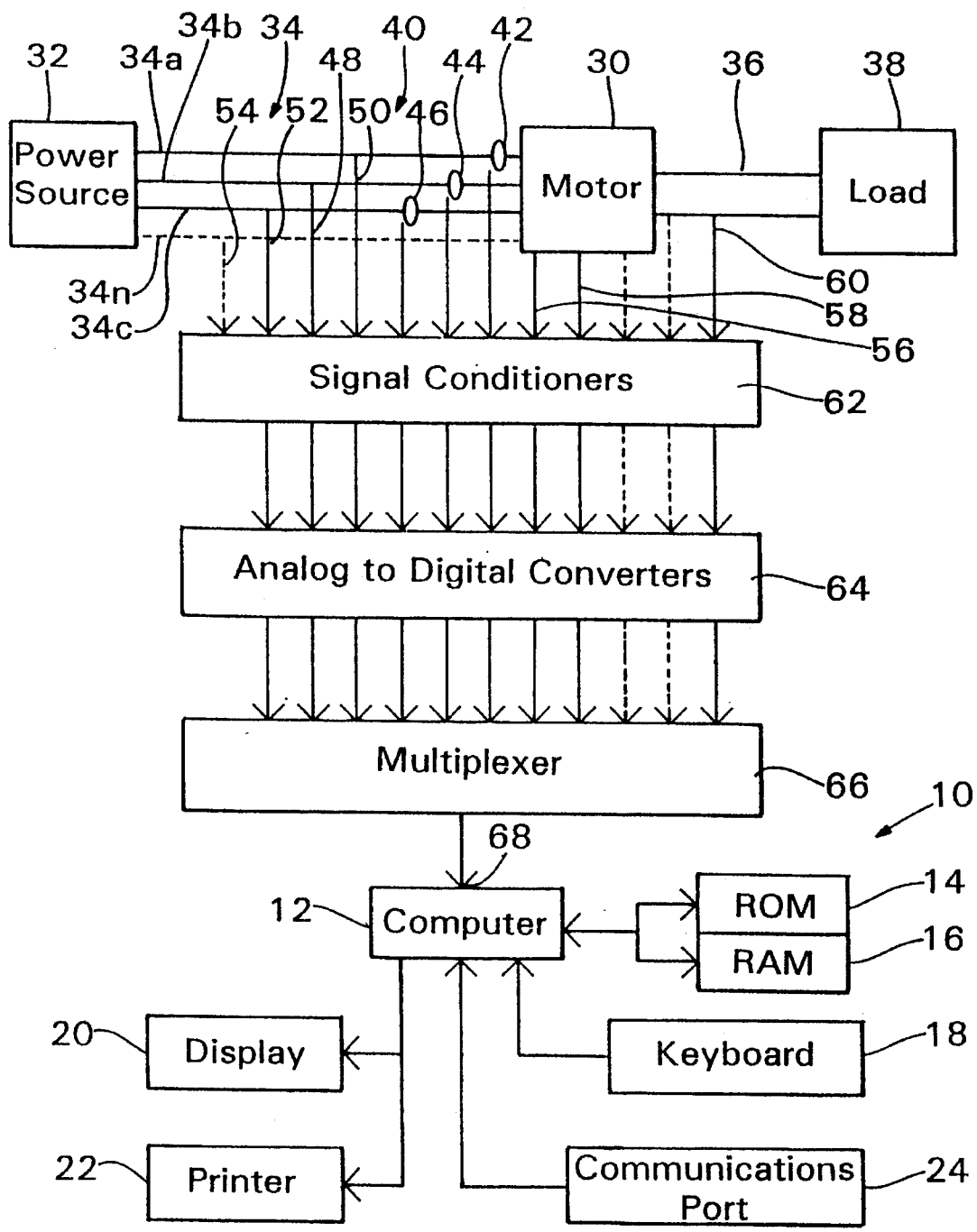
FIG. 1 is a functional schematic block diagram of a preferred embodiment of a system for analysis of a three phase motor in accordance with the present invention.

Referring to the drawings, wherein the same reference numerals indicate like elements throughout the several figures, there is shown in FIG. 1 a functional schematic block diagram of a preferred embodiment of a computer-based system 10 in accordance with the present invention. In the presently preferred embodiment, the system 10 includes a computer 12 which preferably is a personal computer or equivalent. The computer 12 includes a read only memory (ROM) 14 employed for storing fixed information including a computer program and random access memory (RAM) 16 of a predetermined size which is adapted for temporary storage of portions of a computer program as well as data for analysis. The computer 12 further includes a central processing unit or processor (not shown) and, in the present embodiment, a hard disk (not shown) of a type typically employed in such personal computers. While it is presently preferred that the computer 12 comprise a personal computer, it should be appreciated that any other suitable type of computer, such as a lap-top computer, mini computer, microprocessor, digital signal processor, or the like, may alternatively be employed.

A keyboard 18 is employed as the primary input device to permit a user to communicate with the computer 12. A display, in the present embodiment a CRT display 20, and a suitable printer 22 are connected to the computer 12 for the display and recordal of output from the computer 12. It will be appreciated by those skilled in the art that any other type of input device may be employed instead of or in addition to the keyboard 18. Likewise, any other type of suitable output device may be employed in addition to or instead of the display 20 and/or printer 22.

The computer 12 further includes at least one communication port 24 which may be either a parallel port, a serial port, or both. The communication port 24 is employed for receiving data from another location or sending data to another location utilizing a modem or other such transmission device (not shown) in a manner well known in the computer art.

The system 10 as thus far described is typical of a personal computer system well known to those skilled in the art. Variations in the input/output components of the system 10 may be made depending upon particular applications. For example, in some applications, it will not be necessary for both a printer 22 and a display 20. In other applications, a keyboard 18 may not be necessary. It should, therefore, be clearly understood by those skilled in the art that the present invention is not limited to the particular hardware configuration shown in FIG. 1 but may be implemented using any type of suitable hardware configuration.

The above-described system 10 is employed for online analysis of the operation of a polyphase motor driving a load, the polyphase motor being illustrated here schematically as a three-phase motor 30. The motor 30 is connected to a suitable power source 32 utilizing a suitable three-phase cable 34 having individual conductors including an a-phase conductor 34a, a b-phase conductor 34b, a c-phase conductor 34c, and if appropriate, a neutral conductor 34n.

The output of the motor 30 is connected through a suitable output shaft or other type of mechanical transmission means 36 to a load 38 which may be a fan, pump, compressor, valve or virtually any other type of machinery or equipment. Depending upon the application, the transmission means or transmission 36 may include suitable clutches, gearing, belts or other mechanical interconnecting devices (not shown) of a type well known in the art. For the sake of brevity, the combination of the motor 30, transmission 36, and the load 38 will herein sometimes be collectively referred to as the motor system. It should be appreciated by those skilled in the art that the present system 10 may be employed for analysis of any type of polyphase motor 30 which may be connected to any suitable type of power source 32 for driving any type of load 38 (even no load) utilizing any type of transmission means 36, and that the embodiment shown in FIG. 1 is only for the purpose of illustrating a preferred embodiment of the structure and operation of the present invention.

The system 10 further includes a plurality of individual sensors shown collectively as 40, for monitoring predetermined electrical and mechanical variables of the motor 30 and transmission means 36, and for converting the monitored characteristics into electrical signals for processing by the computer 12. In the present embodiment, the sensors 40 include three clamp-on current probes 42, 44, 46, one of the current probes being clamped to each of the conductors 34a, 34b, 34c, of the three phase cable 34 interconnecting the motor 30 with the power source 32. The clamp-on current probes 42, 44, 46 are generally of a type well known in the electrical measurement art and are commercially available from a variety of well known sources. The current probes may also be more permanently mounted current transformers instead of the clamp-on type. Complete details of the structure and operation of the current probes is not necessary for a complete understanding of the present invention.

Figure 2:
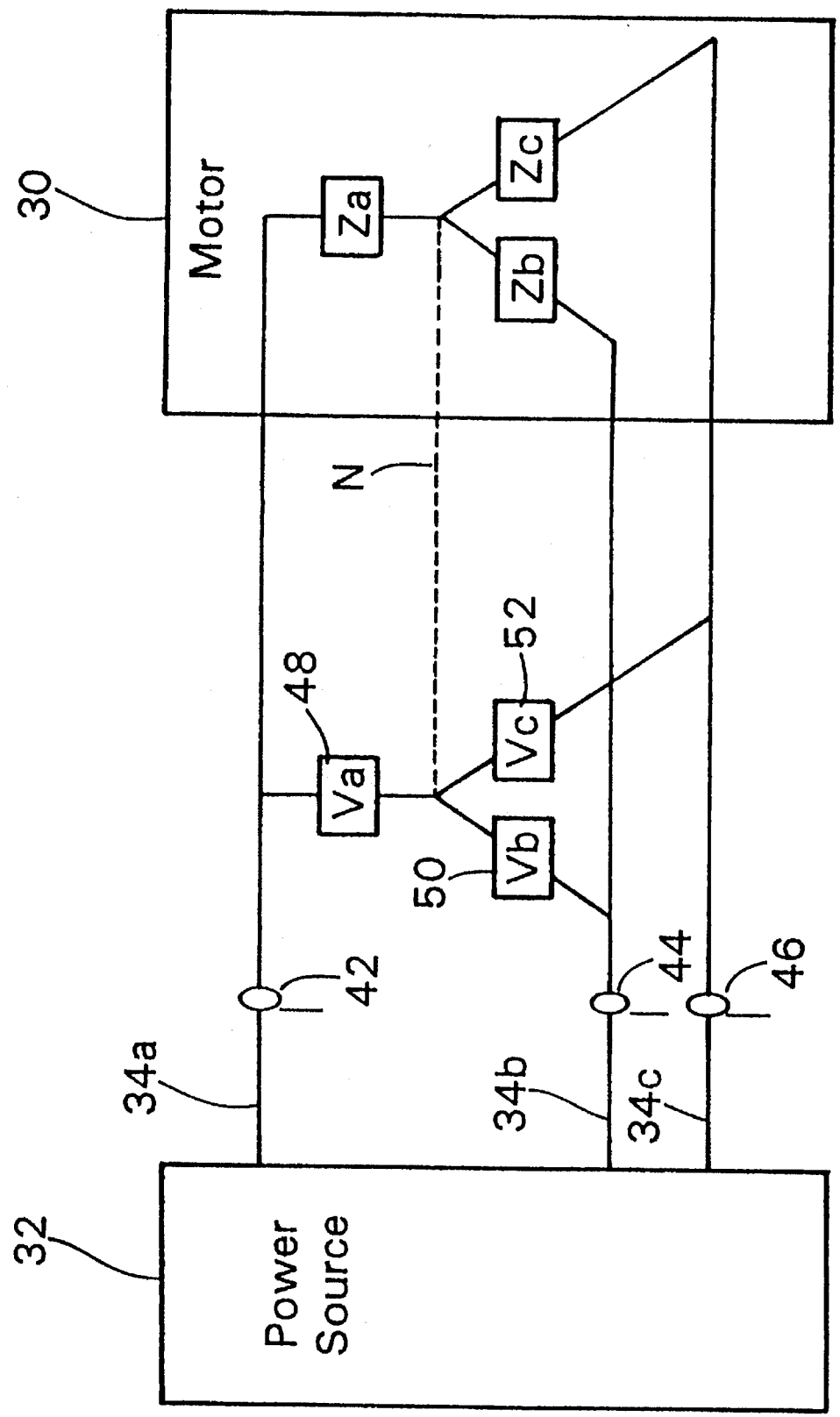
FIG. 2 is a more detailed functional schematic diagram of a portion of the system shown in FIG. 1.

The sensors 40 further include voltage probes 48, 50, 52, each of which is connected to one of the conductors 34a, 34b, 34c of the three phase cable 34 and, if a neutral conductor 34n is present, a fourth voltage probe 54 is connected to the neutral conductor 34n of the cable 34. FIG. 2 shows in greater detail the manner in which the electrical measurements are taken. In the illustrated embodiment, the motor 30 is connected in a wye configuration with an artificial neutral phase. One terminal of each of the voltage probes 48, 50, 52 is physically connected to each of the individual phase conductors 34a, 34b, 34c, respectively, with the other terminals of the voltage probes 48, 50, 52 being connected together to form an artificial neutral. An optional neutral connection line shown in phantom may be connected to the neutral of the motor circuit when the motor circuit is accessible. It should be understood that while the motor 30 illustrated in the present embodiment is connected in a wye configuration, it could be connected in a delta configuration and the voltage probes 48, 50, 52 could be accordingly connected in a delta configuration in a manner which is well known in the art. The voltage probes 48, 50, 52 are generally of a type well known in the art and are commercially available from a variety of sources. The voltage probes may also be of the potential transformer type commonly used at higher voltages. Complete details of the structure and operation of the voltage probes 48, 50, 52 is not necessary for a complete understanding of the present invention.

In addition to the above-discussed electrical sensors, the present system 12 includes one or more mechanical sensors. The mechanical sensors may include a vibration sensor 56 which may be an accelerometer, an acoustic sensor 58, and a tachometer 60 providing a once per revolution phase reference for sensing the rotating speed of the output shaft of the motor 30 and of the shaft of the load 38 if different due to an intervening gear box or belt within the transmission 36. One or more additional mechanical probes may also be provided. Such additional mechanical probes may include pressure transducers and vibration sensors, proximity probes, force sensors, torque sensors, and accelerometers having different locations or orientations from that of sensor 56, etc. Each of the mechanical sensors are adapted to receive and convert sensed mechanical parameters related to the operation of the motor system and convert the received mechanical signals into analogous standard electrical signals. Details of the structure and operation of the various mechanical sensors are not necessary for a complete understanding of the present invention. It should be understood by those skilled in the art that while certain mechanical sensors are specifically discussed and illustrated, other mechanical sensors may be employed either in addition to the discussed sensors or as an alternative to the discussed sensors. Thus, the particular type of mechanical sensors employed in the presently preferred embodiment should not be viewed as a limitation upon the invention.

The system 10 further includes a plurality of signal conditioners 62 which are illustrated collectively on FIG. 1. Preferably, a separate signal conditioner is provided for each of the sensors 40, with the respective output of the sensor 40 being connected directly to the input to the respective signal conditioner 62. Each of the signal conditioners 62 functions in a manner well known in the art to amplify, impedance match, filter and otherwise improve the electrical output signal received from the corresponding sensor 40. The precise structure and operation of each signal conditioner depends upon the particular type of sensor 40 with which the signal conditioner 62 is employed. Preferably, each of the signal conditioners 62 includes an anti-alias low pass filter which functions to improve the integrity of the acquired sensor data by filtering out, prior to digitizing, sensor signal frequencies greater than approximately half of the sampling rate of the digitizer.

The system 10 further includes a plurality of individual analog-to-digital converters 64 shown collectively on FIG. 1. The analog-to-digital converters 64 function in a manner well known in the art to receive the conditioned and filtered analog output signals from the corresponding signal conditioner 62 and convert the received analog signals at a predetermined sampling rate into the digital signals required for data manipulation and analysis by the computer 12. A typical sampling rate could be 1,000 samples per second for each signal. Thus, each of the analog to digital converters 64 produces an output data array or bit stream corresponding to the particular sensor 40 with which the analog-to-digital converter is associated.

The outputs of each of the analog-to-digital converters 64 are provided to the input of a multiplexer 66. The multiplexer 66 which, in the present embodiment is preferably a time division multiplexer, receives the data array signals from each of the analog-to-digital converters 64 and in a manner well known in the art transmits the received data array signals to an appropriate serial input port 68 of the computer 12 in a predetermined time spaced order.

It will be appreciated by those skilled in the art that the signal conditioners 62, analog to digital converters 64, and multiplexer 66 which are employed in connection with the presently preferred embodiment, are each of a type well known in the art and available from a variety of manufacturers. Complete details of the structure and operation of the signal conditioners 62, analog-to-digital converters 64, and multiplexer 66 are generally well known to those skilled in the art and need not be described in greater detail herein. Suffice it to say that the signal conditioners 62, analog-to-digital converters 64, and multiplexer 66 cooperate to take the raw analog output electrical signals from the electrical and mechanical sensors 44 and convert the raw signals into a digital form suitable for processing by the computer 12. It will be appreciated by those skilled in the art that the functions of the signal conditioners 62, analog-to-digital converters 64, and multiplexer 66 may be combined into a single sub-assembly or may be performed in any of several different manners. Thus, while the preferred embodiment employs such components, such components are not intended to be a limitation on the present invention.

Figure 3:
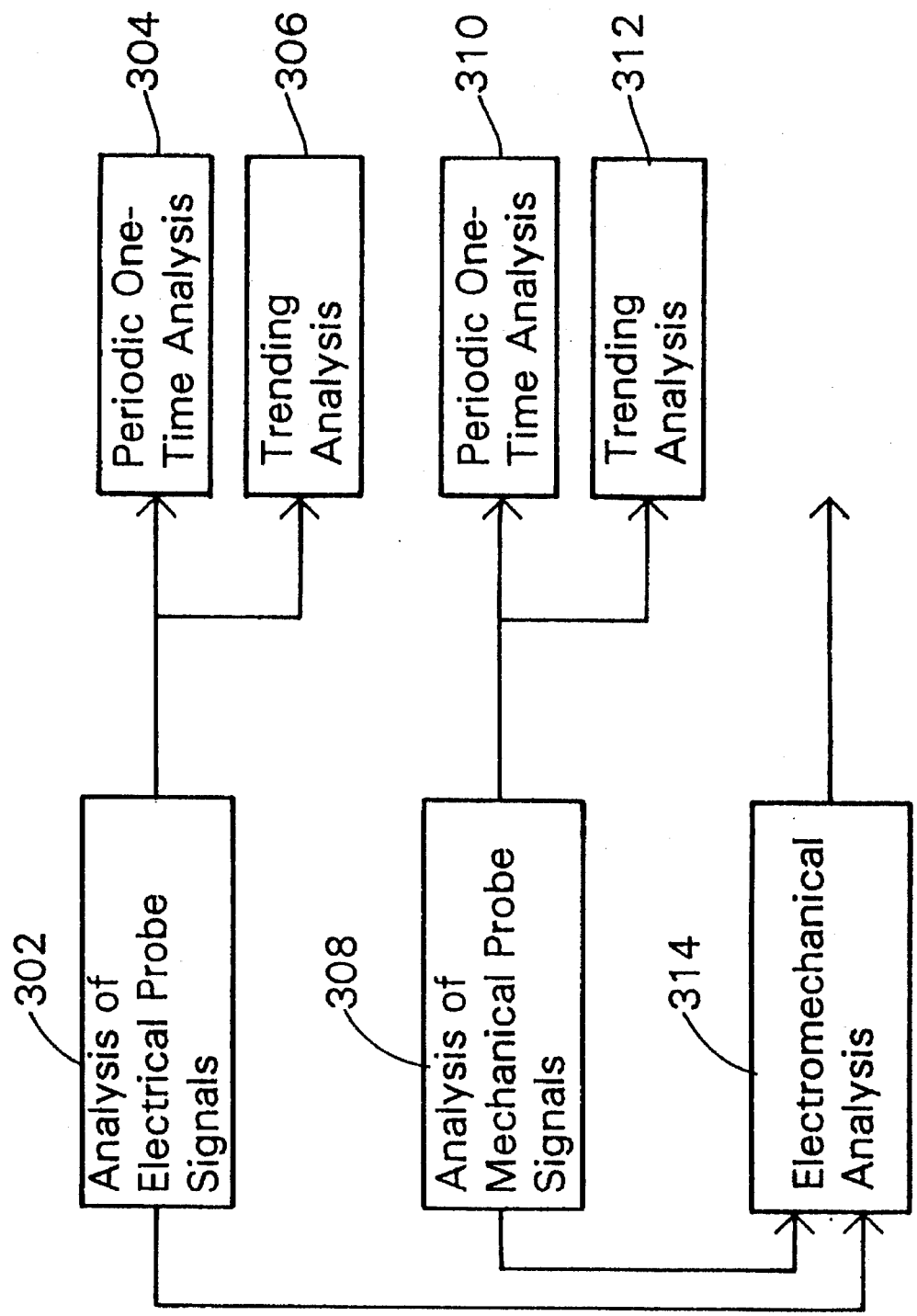
FIG. 3 is a high level functional block diagram of the software operation of the system of FIG. 1.

FIG. 3 is a general functional block diagram of the operation of the computer 12 in providing analysis of the operation of the polyphase motor 30, its transmission 36, and its load 38 (i.e., the motor system). The computer 12 manipulates the sampled digital data received from the electrical and mechanical sensors 40 in a manner hereinafter described and generates highly accurate outputs in the form of discrete data or plots of data versus time (traces) corresponding to particular electrical and mechanical parameters from which specific problems and faults can be identified. Only the particular identified problem(s) need then be repaired, be it on the motor 30, transmission 36, or load 38, thereby saving the cost of a complete motor system overhaul. As illustrated in FIG. 3, the computer 12 essentially simultaneously performs three different but inter-related analyses. The sampled output signals from the electrical probes, representing voltage and current values as a function of time, are analyzed at block 302 to accurately determine a first group of generally electrical motor parameters which include power factor, motor power and the electrical balance of the motor 30 initially indicated in the form of discrete values as a function of time at the same sample rate as the data. From the determined parameters, the computer 12 conducts periodic one-time operational analyses 304 which do not use or depend upon historic data, as well as a generally continuous trending analysis 306 in which historic trending of the first group of motor parameters are taken into consideration to identify trends occurring within the motor 30. The computer 12 simultaneously conducts an analysis of the output signals from the mechanical probes at block 308 to determine a second group of generally mechanical motor system parameters containing information about mechanical balance, misalignment, faulty bearings and gears, and other such mechanical faults. As with the electrical motor parameter analysis, the mechanical parameter analysis includes periodic one-time analyses 310 of each of the mechanical motor parameters, as well as longer term trending analysis 312 which takes into consideration prior calculations of the mechanical parameters in order to identify trends in the operation of the motor 30, transmission 36, and load 38 and to perhaps indicate impending mechanical faults. Finally, the electrical analysis 302 and mechanical analysis 308 are combined to provide a more comprehensive electromechanical analysis 314. In one form of the electromechanical analysis 314, the electrical analysis is viewed as data representing the input to the motor 30, and the mechanical analysis is viewed as the motor output. By comparing the input and output of the motor 30, the efficiency of the motor 30 can be estimated and developing inefficiencies, such as lubrication degradation, can be identified. This type of input-output view also helps to isolate problems as occurring either to the electrical front end or the mechanical back end. The electromechanical analysis 314 can also be used to confirm suspected conditions which appear in both the electrical and mechanical analysis. In addition, transfer functions (frequency response functions) between the electrical and mechanical measurements, can be used to indicate the transmission of fault signals between components and the coherence function of such signals can be used to indicate the degree of common cause of fault.

Figure 4:
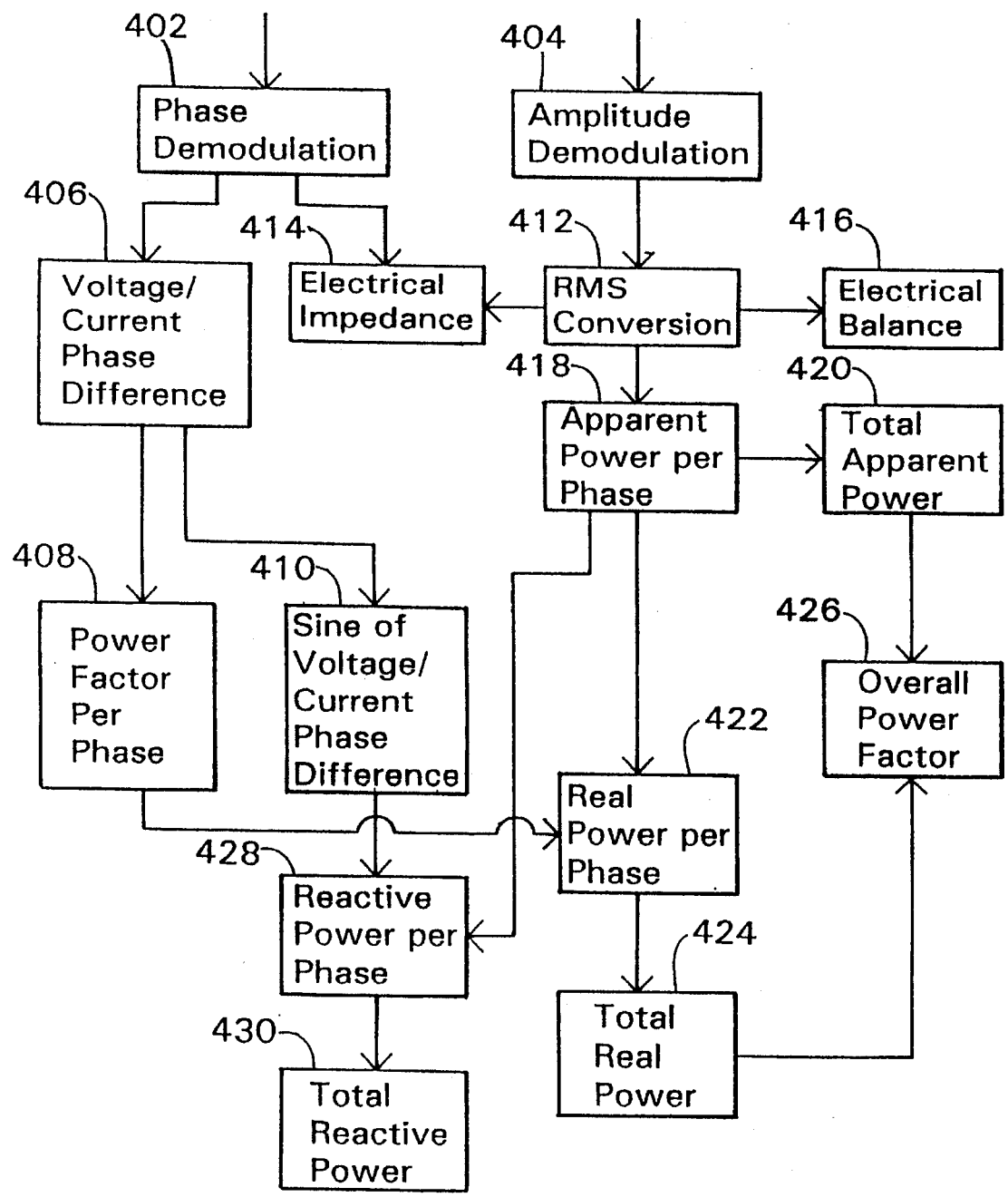
FIG. 4 is a more detailed functional block diagram of the electrical signal analysis portion of the software operation of the system of FIG. 1.

FIG. 4 is a more detailed functional block diagram representation of the steps followed by the computer 12 in analyzing the electrical probe signals. In the presently preferred embodiment, each of the conditioned and digitized signals from each of the three current probes 42, 44, 46, and from the three voltage probes 48, 50, 52 are individually analyzed and processed by the computer 12.

It is generally known that the signals developed by the electrical probes 42, 44, 46, 48, 50, 52 are modulated. For example, in-rush current during start-up of an induction motor is associated with highly dynamic amplitude modulation at the fundamental motor drive frequency (60 Hz or 50 Hz).

In order to improve the accuracy of the estimated voltage and current envelopes, the present invention uses one of several possible analytic signal approaches to more accurately demodulate each of the signals received from the current and voltage probes. The signals from the current and voltage probes are each phase demodulated at block 402 and amplitude demodulated at block 404 with the demodulated results being employed to determine the various electrical motor parameters. In the preferred embodiment, the phase demodulation 402 and amplitude demodulation 404 is accomplished by generating an equivalent analytic signal for each electrical probe.

The analytic signal may be generated for each electrical probe in several different ways. Preferably, the analytic signal is generated by treating the original real signal from each probe as the real part of the analytic signal and then creating an imaginary part of the analytic signal by shifting the original real signal by ninety degrees. Preferably, the calculation of the imaginary part is accomplished in the time domain using a Hilbert transform or some other such ninety degree phase shifter. The analytic signal is the sum of the real and imaginary parts.

The analytic signal can alternatively be obtained by calculating the two-sided spectrum of the measured signal, deleting the negative frequency part of the spectrum and then performing an inverse Fourier transform on two times the positive frequency part to obtain the resulting complex signal. The imaginary part of the complex or analytic signal is 90 degrees out of phase with the real part. Another technique for generating the analytic signal is to hetrodyne (multiply) the real signal by a cosine wave to create an inphase (real) part and by a negative sine wave to create a 90 degrees out-of-phase quadrature (imaginary) part, low-pass filtering each part, and then calculating the instantaneous amplitude as the square root of the sum of squares of the inphase and quadrature parts. Other quadrature-based methods for calculating the analytic signal may be used in the alternative. It should be understood that the specific method employed for determining the analytic signal should not be viewed as a limitation on the present invention.

After phase demodulation 402, which provides angular phase as a function of time of the individual sampled signals including all the voltages and currents, the phase difference between the voltage and current in each electrical phase as a function of time is determined at block 406. The voltage/current phase difference is determined by simply subtracting the angular current phase from the angular voltage phase for each electrical phase (a, b or c).

The power factor for each electrical phase is then determined in block 408 by determining the cosine of the voltage/current phase difference determined in block 406. The sine of the voltage/current phase difference determined in block 406 is also calculated in block 410 for purposes which will hereinafter become apparent. Alternatively, the latter value may be evaluated as the square root of the sum of squares of unity less the squares of the power factors for each phase from block 408.

The amplitude demodulation accomplished in block 404 yields very-accurate voltage and current envelopes for each of the phases. Since most power parameters are expressed in terms of rms, the envelopes, which yield peak values, are multiplied by the square root of 0.5 to effectively convert the amplitude demodulated outputs from block 404 for each phase into corresponding rms values at block 412. Several useful parameters are thereafter developed from the converted rms values output from block 412.

The instantaneous equivalent electrical impedance of the motor 30 is determined in block 414. The determination of electrical impedance is accomplished by dividing the complex voltage for each phase by the complex current for each phase. In the present embodiment, in polar form, the electrical impedance can be evaluated as the ratio of the instantaneous amplitudes and the subtration of the instantaneous phases which are then converted to a complex form.

Electrical balance or imbalance is determined at block 416 utilizing all three phases. It is well known that it is stressful for a motor to operate continuously in a state of electrical imbalance. Current imbalance, voltage imbalance and resistive and inductive imbalances are all important indicators of general motor electrical health. The electrical imbalances, voltage, current, resistance, reactance, etc., are typically quantified by the formula:

$$\frac{\text{High Value} - \text{Low Value}}{\text{Average Value}} \times 100\%$$

The present invention permits on-line determination of electrical impedance at block 414 as well as electrical balance at block 416 while the motor 30 is in actual operation. Conventional methods involve taking the motor 30 off line to make the necessary static and unloaded measurements in order to permit calculation of electrical impedance and/or electrical balance. For example, conventional methods must measure static imbalances off-line and then use the measurements to estimate the imbalances during operation. The ability of the present invention to accurately determine electrical impedance and electrical balance during actual motor operation facilitates trending analysis which provides the ability to obtain advance warning of developing problems in the motor. The electrical impedance per phase from block 414 and the electrical balance from block 416 are displayed on the display 20 and, if desired, a hard copy may be printed by the printer 22. These parameters may be used to detect shorted windings, high contact resistance, and other degradations that typically do not occur equally in each phase.

The instantaneous current and voltage rms values for each phase are multiplied together at block 418 to obtain an indication of apparent power per phase referred to as instantaneous power per phase. Total apparent power or instantaneous power is the sum of the apparent power per phase for all three phases and is determined at block 420. The real power per phase is determined at block 422 as the product of the apparent power per phase from block 418 and the power factor per phase from block 408. The total real power is then obtained at block 424 by adding together the real power per phase for each of the phases from block 422. The real power per phase from block 422 and the total real power from block 424 are displayed on the display 20 and, if desired, a hard copy may be printed by the printer 22.

Figure 5:
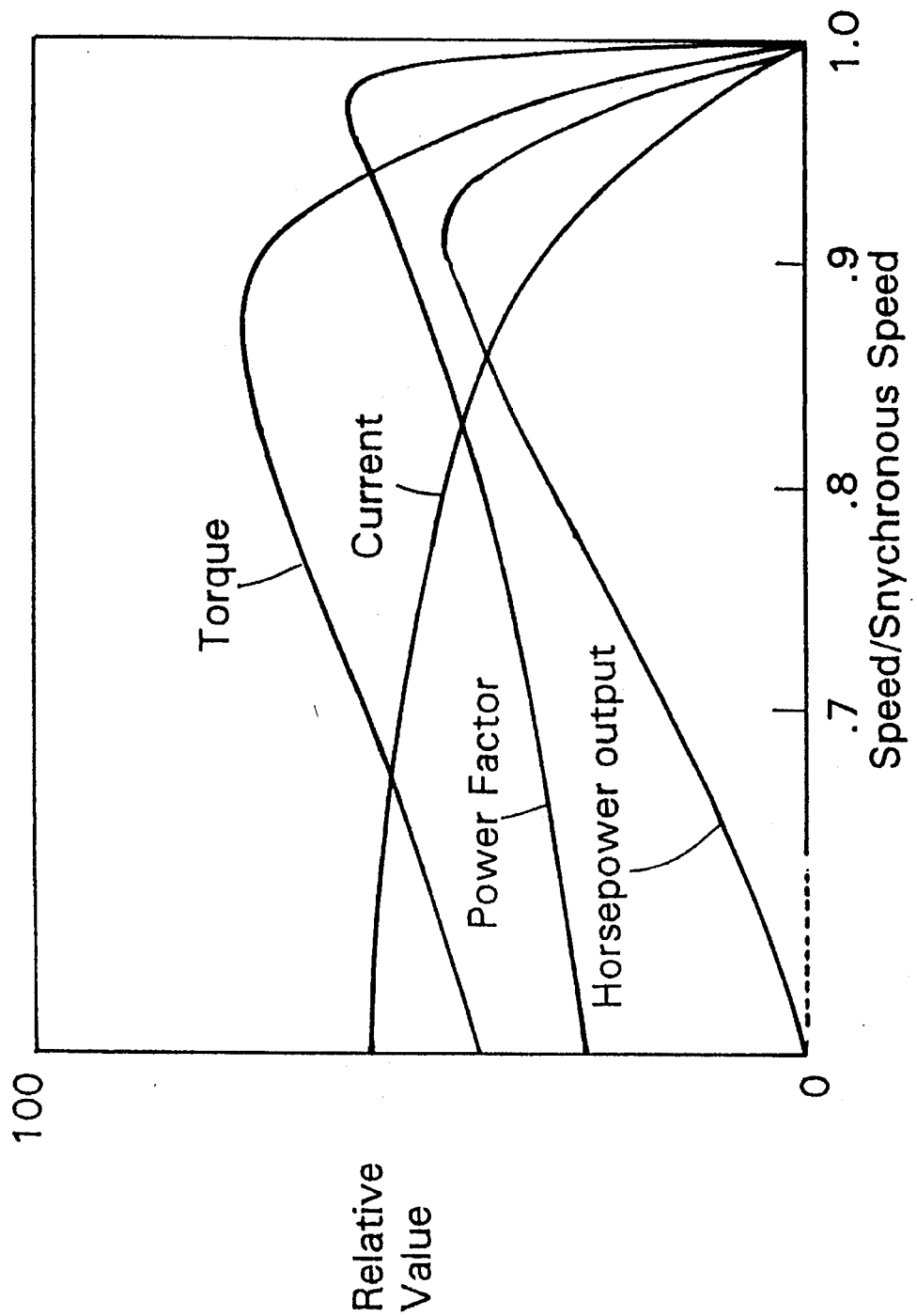
FIG. 5 is a graphic illustration of the relationship between certain operating parameters of an induction motor.

The overall power factor for the motor 30 is calculated at block 426 by dividing the total real power from block 424 by the total apparent power from block 420. The overall power factor is a more sensitive indicator of load changes than is the instantaneous current when the motor is lightly loaded. FIG. 5 illustrates the relatively steeper slope (high sensitivity) of the overall power factor as compared to the current where the speed approaches synchronous speed typical of light loading. Also shown in FIG. 5 are the curves of torque and horsepower output. The overall power factor from block 426 is displayed on the display 20 and, if desired, a hard copy is provided by the printer 22. The overall power factor trace, as a function of time, is the optimum electrical diagnostic trace under light loading conditions for the reasons cited above.

Referring again to FIG. 4, the reactive power per phase is determined at block 428 as the product of the apparent power per phase and the sine of the voltage/current phase difference. Adding together the determined reactive power per phase for each phase results in the total reactive power at block 430. The reactive power per phase from block 428 and the total reactive power from block 430 are both displayed on display 20 and may be printed out on the printer 22 is desired. Reactive power is wasteful because it requires current, but does not deliver real power to the load.

The analytic signal approach for the demodulation of the outputs of the voltage and current sensors provides improved accuracy of estimation of the instantaneous amplitude and phase for each probe signal individually as well as improved accuracy of the important composite measures of power, power factor, and electrical balance. Accurate demodulation is very important for such polyphase measurements since it permits the calculation of total power, overall power factor, and motor balance in a highly accurate manner.

It is known in the art that current probes of the type typically used in measuring motor current can have a degree of non-linearity associated with them. The non-linearity of such current probes is illustrated in FIG. 6 which shows the measured current indicated by a typical commercially available current probe along the Y axis as a function of the true current along the X axis. As shown by the solid line on FIG. 6, such current probes are reasonably linear over a large percentage of the range as illustrated by line 610, the predominant sensitivity. The overall sensitivity is shown by dotted line 620. The point at which the probe becomes non-linear on the low end is identified as point 630. There is often a similar point where the probe becomes non-linear on the high end of the curve which is not illustrated in FIG. 6.

The non-linearity of such existing current probes have several adverse effects when employed for motor analysis. First, such non-linearity reduces the overall accuracy of the sensed current data from the motor, particularly at the low current end. Second, such non-linearities often force the avoidance of using either the high end or low end of the curve in order to assure accurate data. A user who must have high accuracy across the entire range may not be able to purchase probes that have the required linearity.

The present invention overcomes the non-linear effects of the existing current probes by computer correcting the probe characteristics in software, based upon actual calibration data. The computer records indicated probe outputs against actual current levels over the full range of expected current levels. The computer then applies appropriate corrections to subsequently correct all current values indicated by that current probe. The computer correction is based upon a mathematical function that approximates the probe input-output curve at all points. In the preferred embodiment, the curve is sectorized, applying different mathematical functions to different ranges of the curve. Preferably, the curve is divided into three sectors, with each sector being approximated by a cubic polynomial whose coefficients are derived by the well known least squares approximation technique. Zero is a common reference point since the current probe channel output can always be adjusted to zero in the absence of any current. Thus, the sector closest to zero is forced through zero and the other sectors have an added offset. To smooth the transitions between sectors, neighboring points from adjoining sectors are included when calculating the cubic coefficients.

As a first alternative, a larger number of lower order sectors, such as eight linear sectors, may be employed to provide the mathematical model of the input-output curve. A further alternative is to approximate the curve based upon Fourier coefficients. Since the non-linearity of the curve repeats every cycle of the current (i.e., sixty times per second for a 60 Hz electrical signal), the distortion of the output signal can be described in terms of a Fourier series and may be approximated by a truncated Fourier series. When viewed in this manner, the non-linearity in the input-output relation of the probe is essentially equivalent to harmonic distortion in the output wave form. Evidence suggests that non-linearity is a fixed function of the probe, that is, the peak of a five amp signal, for example, produces the same output as the halfway to peak value of a ten amp signal. In terms of harmonic distortion, the fixed function translates into the condition that the phase relation between the fundamental electrical frequency and its harmonics must be either zero or 180 degrees, thereby simplifying the Fourier solution to the problem. The Fourier series coefficients (amplitude, magnitude and phase) are best determined utilizing the analytic signal approach described above. For zero to 180 degrees, the error in amplitude in terms of the Fourier coefficients is:

$$\text{error} = \sum_{k=2}^{K} A_k \cos \left\{ k \cos^{-1}\left( \frac{x_1}{A_1} \right) + (\theta_k - k\theta_1) \right\}$$

where k=harmonic number (1=fundamental)

K=maximum harmonic considered

A=amplitude x=instantaneous current value

θ=phase

Knowing the error due to the presence of harmonics enables correction by cancelling the error. In this manner, knowing that the error is due to the presence of the harmonic, enables correction by cancelling the error.

The present invention also overcomes system effects which distort angular phase relationships such as channel skew from non-simultaneous sampling and non-linear phase response of system filters. In the preferred embodiment, the phase of a single known source is measured using multiple probes on multiple channels. If the source is maintained at a known power factor, then any difference between current and voltage phase measurements can be attributed to system errors, i.e., the combination of sensor, signal conditioning, and analog-to-digital converter errors. By utilizing a known, stable source, any error resulting from non-simultaneous sampling of the analog-to-digital converters can be directly evaluated and compensated for in the system. The effects of signal conditioning errors can be isolated by connecting the same stable input signal into the input of a plurality of signal conditioners. Once the effect of analog-to-digital conversion is factored out, any remaining error between channels is due to the signal conditioners. Finally, by connecting the probes to the same stable source, factoring out differences due to analog-to-digital conversion and phase distortion due to the signal conditioners, the phase errors due to probes themselves can be determined. Utilizing all of this information, system errors are compensated for by the computer 12 which applies the phase and amplitude corrections to all subsequent data. Compensation for system errors is important because it is desirable to measure current and voltage phases very accurately in order to accurately determine power factor and power (real, reactive and apparent), not only on a per phase basis, but also the total power factor and power for the polyphase motor 30. This result can be accomplished by utilizing a stable calibration source and an extremely accurate phase measurement technique based upon statistical estimation using accurate phase demodulation.

In general, meters are commercially available for measuring phase only to approximately 0.2 degrees. Such meters are expensive and yet still are insufficient for purposes of the present invention. For example, a 0.2 degree error in phase at a power factor of 0.035 produces a ten percent error in the power factor which in turn produces a ten percent error in other power measurements.

In order to obtain a significant improvement in phase accuracy, the present invention hetrodynes the current and voltage measurements by a locally synthesized signal of approximately the same frequency. More specifically, the incoming electrical signal, once digitized, is multiplied by a cosine of a close frequency and by the negative of the sine of the same frequency. The two resulting products are each convolved with a low pass filter having a cut-off low enough to filter out the sum frequencies and any products of harmonics. The instantaneous phase is then determined as the arc tangent of the ratio of the imaginary portion of the result over the real portion of the result.

In order to map the arc tangent over a range of $2\pi$ and to avoid division by zero, the full algorithm is established as follows:

(a) if the real portion (denominator) is zero and the imaginary portion (numerator) is positive, the angle is $\pi$ over 2;

(b) if the real portion is zero and the imaginary portion is negative, the angle is minus $\pi$ divided by 2;

(c) if the imaginary portion and the real portion are both zero, the result is mapped into the quadrant between zero and $\pi$ divided by 2;

(d) if the imaginary portion is zero and the real portion is positive, the angle is zero;

(e) if the imaginary portion is zero and the real portion is negative, the angle is $\pi$; and (f) other combinations of the real and imaginary portions (positive and negative) are mapped in accordance with the analytic geometry conventions.

After the angle has been carefully distributed into the proper quadrants as discussed above, it is unwrapped by allowing the phase to continue to grow in value so that it does not go through sudden shifts when it progresses from $2\pi$ in one cycle to zero in the next. The preferred manner of accomplishing this result is to monitor the phase over time, keeping track (count) of the current $2\pi$ branch when unwrapping the phase. The kth branch is K $2\pi+(0\rightarrow 2\pi)$. For example K=2 corresponds to the range from $4\pi$ to $6\pi$. When the absolute value of a sudden range change in phase is greater than $\pi$, than $2\pi$, zero, or minus $2\pi$ is added, whichever results in the smallest change with respect to the most recent K branch. K is then changed accordingly.

The result of the foregoing is a smooth, differentiable plot of phase versus time. Preferably, data is collected for a predetermined time, such as seven seconds, and then the unwrapping calculation is performed, again for a predetermined time, preferably seven seconds. The first and last seconds of the data are deleted and whatever data is necessary to eliminate the end effects of the filter are also deleted. With the remaining central section of the data, a linear regression is performed, the intercept comprising an accurate statistical estimate of the phase at the beginning of the remaining central section of the data by having the start time be zero at the beginning of the central data section. After forming the foregoing calculation for several channels, the result can be compared for establishing phase differences between the channels.

An alternate method of accurately measuring phase is to determine the difference in phase at each instantaneous point between the channels being compared and calculate the mean value. Both the regression and averaging methods have the effect of enhancing the statistical accuracy of the measurement and thereby providing a substantial improvement over prior art phase measuring equipment.

As stated above, the present invention is used for analysis of electrical measurements in order to identify mechanical faults or deterioration of the motor 30 and/or transmission 36. One such mechanical problem which often occurs is a broken rotor bar. A broken rotor bar generally results in a reduction in torque in every rotation and has a corresponding effect on each of the three electrical phases. More specifically, the three phases cause three magnetic fields to rotate around at synchronous speed. The rotor rotates around more slowly, differing in speed by a slip frequency. Since each rotor bar rotates through each magnetic field twice, a broken rotor bar, which causes less back emf than a non-broken rotor bar, effects each phase current at two times the slip frequency. The present state of the art is to examine the spectrum of the current in one phase for side bands separated from the line frequency by two times the slip frequency, and see if their amplitude is more than 1/1000th of the amplitude of the line frequency component. If only 1/500th less in amplitude, one might assume two broken rotor bars, etc. Also, if the motor is only lightly loaded the slip frequency is much less and the side bands either might not been seen or because their frequency is so close to the line frequency, the side band frequency of the component might be assumed to be two times slip frequency when it is not. The present invention overcomes these problems in three ways. First, it utilizes the power factor for each phase as a function of time, box 408 in FIG. 4. Power factor is more sensitive than current in picking up the effect of a broken rotor bar especially when the motor is lightly loaded. Second, the power factor of each phase is looked at for the time of the total slip period, which is one divided by the slip frequency. Each broken rotor bar shows up twice over this period, 180 degrees apart. In this way, multiple broken rotor bars and their location can be clearly noted, not just conjectured about as is done presently. Finally, the power factor trace of each phase is compared with the other two traces. A broken rotor bar shows up sequentially, first in phase a, then in phase b, then in phase c. A disturbance showing up in all three phases simultaneously is not a broken rotor bar. By using all three phases, and by looking at the clearest diagnostic representation of the problem, the present invention provides significantly improved definitive diagnostics not previously achievable.

Rotating eccentricity of the motor rotor, as with rotor unbalance, also affects all phases sequentially but has a smoother effect and can be distinguished from broken rotor bars by the resulting sinusoidal nature of the trace at two times slip frequency and the corresponding lack of harmonics which are generated.

Shaft torsional loads resulting from mechanical effects can also appear more clearly in the electrical measurements than the mechanical measurements. Such problems occur, for instance, in the presence of a damaged or missing tooth in a reduction gear train. The presence of a damaged or missing tooth may be identified by way of mechanical vibration sensors, but it will have a stronger torque modulation effect. As before, this invention allows the time traces of all three phases to be examined. In this case, under high torque loading, it might be more effective to examine the real power traces for each phase, box 422 in FIG. 4. Here the damaged tooth is seen simultaneously in each of the three phase traces, unlike with broken rotor bars where the effect is sequential between phases. The damaged tooth effect repeats in the time traces every rotational period of the gear that it is on. If there were two damaged teeth on that gear, the effect is seen twice in each rotational period of that gear. Furthermore, the separation of the two effects per rotational period of the gear mirrors the separation of the two damaged teeth on the gear itself so that far more diagnostic information is being obtained than with just spectral information alone as is typical of the present state of the art.

Imbalance measurements can be made utilizing the voltage, current, equivalent resistance and equivalent inductance determinations while the motor is actually operating. A significant current imbalance can cause motor overheating which can drastically reduce motor life.

While a periodic one-time analysis can detect serious problems for a short time record recorded during motor operation, historical trending can provide advanced warning of impending problems. By recording accurate measurements at different times and plotting the resulting records over time or otherwise automatically searching for trends over time, patterns can be detected that indicate a particular parameter is headed toward a fault condition while it is still within acceptable limits. For example, if the rotor of the motor is becoming uncentered or offset in the air gap, the magnetic field rotating around at synchronous speed for each phase would have rotor bars going by with reduced air gap on one side of the motor, and at the same time have rotor bars going by with increased air gap on the other side of the motor. This situation would repeat at say zero degrees and 180 degrees in the synchronous cycle. At 90 degrees and at 270 degrees in the synchronous cycle, both air gaps would be normal. Because the effect of an air gap change is not linear, being stronger at reduced gap than at increased gap, the effect of the motor rotor becoming eccentric would result in an increased effect at both zero degrees and 180 degrees for this particular electrical phase. This increased effect showing up two times in the synchronous cycle in the current amplitude, the power factor, or the real power traces for that particular electrical phase, would show up as well in the other phases, but displaced in the synchronous cycle by 120 degrees from the traces of the original electrical phase. Thus it is the comparison of traces between electrical phases that confirms the diagnosis. The effect can be noted when it is too small to be of concern, and as indicated here, it can be trended so that if it is getting worse, the point at which an operator will want to take corrective measures can be projected. This allowance for the preplanning of downtime is one of the essential benefits of trending. Also, it helps to ensure that the problem will be corrected before it becomes an operational problem, shortening motor life and perhaps resulting in catastrophic motor failure. Trending can best be achieved when the data being reviewed is very accurate. The use of the above-discussed demodulation techniques, correction of phase inaccuracies, correction of probe non-linearity, etc., of the present invention provides a practical way to achieve the required accuracy for proper trend analysis.

For optimum analysis of the motor system, mechanical measurements are also obtained in connection with the preferred embodiment of the present invention. In common usage are motion sensors which can measure displacement, velocity or acceleration. Multiple motion sensors may also be employed. For example, perpendicular radial proximity probes can describe a shaft orbit which can, for instance, be employed for detecting a cracked shaft by evidencing two per revolution response. A third proximity probe in the axial direction can assist in detecting shaft misalignment. While proximity probes are employed for measuring the displacement of the shaft with respect to the bearings, inertial sensors, such as accelerometers, on the bearing housing, provide an indication of the motion of the bearing in inertial space. Accelerometers are commonly used because of their large dynamic range, sensitivity and ease of mounting. Preferably, accelerometers are employed in three orthogonal axes to ensure that no vibration signal is missed and to help diagnose the nature of a fault by determining which axis has the greatest amplitude. If only one accelerometer is utilized, it is preferably oriented radially on the housing proximate the output of the transmission 36.

A typical raw acceleration signal contains information about the motion of the bearing to which the accelerometer is attached. However, the information of interest may be obscured by irrelevant signals. Two alternative signals derived from the raw acceleration signal may be helpful in this regard. The first alternative signal comprises the low frequency components acquired from the raw acceleration signal by low pass filtering. Parameters such as low order harmonics of running speed and slip frequency are easier to detect from the low frequency components. The other modification of the raw acceleration signal consists of high pass filtering and then extracting the envelope of the resulting signal. The high pass filtering eliminates ordinary vibration signals, passing only impulse type signals, i.e., signals which are very short in the time domain which generate very high frequency. Such high frequency excitation stimulates the high natural frequencies of some of the motor and gear means structural components such as the bearing race. The natural frequencies themselves are not of interest since they act only as a signal carrier. The envelope is of more interest since it indicates the repetition pattern of the impulse fault. The repetition rate can be useful for locating a fault such as a spall in the outer race of a bearing which generates an impulse each time a rolling element passes. Spectral analysis of the impulse repetition rate can determine that the outer race is at fault. The accelerometer envelope is useful for detecting impulsive signals originating from such faults as inner race, outer race, and rolling element spalls, missing teeth in gears, and rotor rubbing. The low frequency accelerometer signal is useful for detecting and diagnosing misalignment between mechanical components such as between the motor and gear means, rotor unbalance, and some gear mesh abnormalities.

While many of the above-described faults can be detected from one time analysis, more subtle problems can be detected by trend analysis. For example, very early stages of motor rotor rubbing may be detected by trending the envelope spectra over time, permitting the fault to be corrected before reaching a dangerous stage.

The integration of mechanical and electrical analyses also provides an added benefit. For example, the damaged or missing tooth on a gear results in a distinctive vibrational signal which is picked up from the accelerometer measurement and a periodic torque anomaly which may be detected in the current, power and especially power factor traces. By comparing the two types of measurements and their phase relationships, the existence of the gear problem can be confirmed and the seriousness of the problem can be estimated. The exact angular location of the faulty tooth can also be determined.

As another example, changes in the efficiency of the motor/gear means drive system can be monitored. If the mechanical measurement is selected to be torque, such as measured by a wheatstone bridge strain gauge torque meter, and the electrical measurement selected is power, at a given speed, the ratio of the selected value should be constant. If it is observed that the output torque decreases over time while the motor power remains constant, a developing inefficiency, such as lubrication degradation, is suggested.

The concurrent use of electrical and mechanical sensors is also advantageous in that the two approaches complement each other. The electrical motor measurements are primarily sensitive to angle or torque modulations while the mechanical measurements are primarily sensitive to linear (radial or axial) modulation. Using the two types of sensors together is valuable in isolating a particular problem. For example, if a pump has an unbalanced impeller, a radial accelerometer at one of the pump bearings will see a once per revolution effect caused by the rotating unbalance force. The motor driving the pump will be unaware of the pump unbalance in any of its electrical traces, either directly measured or developed, since the pump rotor unbalance does not affect the torque of the motor. However, if the pump impeller unbalance becomes great enough, and if in addition the pump impeller is radially offset relative to its diffuser, this would cause the impeller to get very close (radially) to its diffuser during just one part of its rotational cycle. In this case there would be a once per rev mechanical vibration due to the unbalance as before, plus now in addition, a once per rev torque effect caused by the closeness to the diffuser that occurs once per rev, and this is reflected back to the motor as a once per rev variation in the current, power factor, and real power traces. Additionally, the electrical traces of all three phases would see this once per rev variation simultaneously, thereby differentiating it from the offset motor rotor, or from a mechanically unbalanced motor rotor, both previously discussed.

The power of this invention in diagnosing motor systems over the present state of the art derives from the inclusion of traces from more than one electrical phase to more clearly differentiate between different problems, the use of the analytic signal in demodulating the basic raw electrical signals to obtain vastly improved demodulated electrical traces, the combination of these improved electrical traces with mechanical traces to further differentiate between problems, and improved calibration means for both probes and conditioning circuitry to allow more sensitive trending to be carried out.

From the foregoing description of a preferred embodiment, it can be seen that the present invention comprises an improved method and apparatus for on-line analysis of polyphase electrical motors and their driven machines. It will be appreciated by those skilled in the art that changes could be made to the embodiment described above without departing from the broad inventive concept thereof. It is understood, therefore, that this invention is not limited to the particular embodiment disclosed, but it is intended to cover modifications within the spirit and scope of the present invention as defined by the appended claims.

We claim:

1. A method of determining at least one operating parameter for determining the operating condition of a polyphase electrical motor system comprising the steps of:

(a) sensing the instantaneous current signal as a function of time for more than one electrical phase of the motor;

(b) sensing the instantaneous voltage signal as a function of time for more than one electrical phase of the motor;

(c) amplitude demodulating the sensed current signals and the sensed voltage signals to provide an amplitude demodulated current signal as a function of time and an amplitude demodulated voltage signal as a function of time for more than one electrical phase;

(d) phase demodulating the sensed current signals and the sensed voltage signals to provide a phase demodulated current signal as a function of time and a phase demodulated voltage signal as a function of time for more than one electrical phase; and (e) utilizing the amplitude demodulated current and voltage signals and the phase demodulated current and voltage signals to determine at least one electrical motor operating parameter as a function of time from the group consisting of: total real power, real power per phase, total reactive power, reactive power per phase, total apparent power, apparent power per phase, overall power factor, power factor per phase, electrical impedance per phase, and electrical balance.

2. The method as recited in claim 1 wherein demodulation of the sensed current signals and the sensed voltage signals is accomplished by generating an equivalent analytic signal for the sensed current and voltage signals.

3. The method as recited in claim 2 wherein the analytic signal for the sensed current and voltage signal is generated by using the sensed signal as the real part of the analytic signal and shifting the sensed signal by 90 degrees to create the imaginary part of the analytic signal.

4. The method as recited in claim 3 wherein the imaginary part of the analytic signal is created using a Hilbert transform of the sensed signal.

5. The method as recited in claim 2 wherein the analytic signal for the sensed current and voltage signals is generated by forcing the negative spectrum of the sensed signal to zero, calculating the two sided spectrum, deleting the negative frequency from the spectrum, multiplying by two and performing an inverse Fourier transform.

6. The method as recited in claim 2 wherein the analytic signal for the sensed current and voltage signals is generated by hetrodyning the sensed signals by a cosine wave to create a real part of the analytic signal and by a negative sine wave to create an imaginary part of the analytic signal.

7. The method as recited in claim 1 further including the steps of:
   determining the phase angle difference between the phase demodulated voltage signal and the phase demodulated current signal for each demodulated electrical phase as a function of time; and
   determining the cosine of the phase difference between the phase demodulated voltage signal and the phase demodulated current signal for each demodulated electrical phase to establish a power factor for demodulated electrical phases as a function of time.

8. The method as recited in claim 1 further comprising the steps of:
   dividing the amplitude demodulated voltage signal by the amplitude demodulated current signal to establish the instantaneous equivalent electrical impedance amplitude for that electrical phase; and
   determining the phase angle difference between the phase demodulated voltage signal and the phase demodulated current signal to yield the instantaneous equivalent impedance phase angle for that electrical phase.

9. The method as recited in claim 1 further including the step of determining electrical balance by comparing the amplitude values of the demodulated current and voltage signals for each demodulated electrical phase.

10. The method as recited in claim 1 further including the steps of:
    converting the amplitude demodulated current signals and the amplitude demodulated voltage signals into rms values; and
    multiplying together the demodulated current and voltage rms values for each demodulated electrical phase to establish the apparent power per each such phase.

11. The method as recited in claim 10 further comprising the step of adding together all of the determined apparent powers per phase of all of the electrical phases to establish the total apparent power.

12. The method as recited in claim 11 further comprising the steps of:
    determining the phase difference between the phase demodulated voltage signal and the phase demodulated current signal for each demodulated electrical phase as a function of time;
    determining the cosine of the phase difference between the phase demodulated voltage signal and the phase demodulated current signal for each demodulated electrical phase to establish a power factor for each such phase as a function of time; and
    multiplying together the apparent power per phase and the power factor per phase to establish the real power per phase for each demodulated electrical phase.

13. The method as recited in claim 12 further comprising the step of adding together the real power per phase for all of the electrical phases to establish the total real power.

14. The method as recited in claim 13 further comprising the steps of:
    adding together each of the determined apparent powers per phase of all of the electrical phases to establish the total apparent power; and
    dividing the total real power by the total apparent power to establish an overall power factor.

15. The method as recited in claim 10 further comprising the steps of:
    determining the phase difference between the phase demodulated voltage signal and the phase demodulated current signal for each demodulated electrical phase as a function of time;
    determining the sine of the phase difference between the phase demodulated voltage signal and the phase demodulated current signal for each demodulated electrical phase;
    multiplying together the apparent power per phase and the sine of the phase difference between the phase demodulated voltage signal and the phase demodulated current signal for each such phase to establish a reactive power per phase for each demodulated electrical phase.

16. The method as recited in claim 15 wherein the reactive power for all of the electrical phases is added together to provide the total reactive power.

17. The method as recited in claim 1 wherein the accuracy of the sensed instantaneous current signals is improved by taking into account known non-linearities of each current sensor to remove resulting non-linearities from the current signals.

18. The method as recited in claim 17 wherein the non-linearities are removed by curve fitting the true current against the output signal from each sensor.

19. The method as recited in claim 1 further comprising the steps of:
    sensing at least one non-electrical operating parameter of the motor system as a function of time and generating a proportional electrical signal; and
    comparing the sensed non-electrical parameter signal with at least one electrical motor operating parameter as a function of time to determine the operating condition of the motor system.

20. The method as recited in claim 19 wherein the non-electrical operating parameter is selected from the group consisting of surface acceleration, surface velocity, surface displacement, surface strain, dynamic pressures, force, torque, and speed.

21. A method of determining at least one operating parameter for detecting the operating condition of a polyphase electrical motor system comprising the steps of:
    (a) sensing the instantaneous current signal as a function of time for more than one electrical phase of the motor;
    (b) sensing the instantaneous voltage signal as a function of time for more than one electrical phase of the motor;
    (c) amplitude demodulating the sensed current signals and the sensed voltage signals to provide an amplitude demodulated current signal as a function of time and an amplitude demodulated voltage signal as a function of time for more than one electrical phase; and (d) utilizing the amplitude demodulated current and voltage signals to determine at least one electrical motor operating parameter as a function of time from the group consisting of: total apparent power, apparent power per phase, and electrical balance.

22. A method of determining the power factor per phase for detecting the operating condition of a polyphase electrical motor system comprising the steps of:

(a) sensing the instantaneous current signal as a function of time for more than one electrical phase of the motor;

(b) sensing the instantaneous voltage signal as a function of time for more than one electrical phase of the motor;

(c) phase demodulating the sensed current signals and the sensed voltage signals to provide a phase demodulated current signal as a function of time and a phase demodulated voltage signal as a function of time for more than one electrical phase; and (d) utilizing the amplitude demodulated current and voltage signals and the phase demodulated current and voltage signals to determine the power factor per phase as a function of time.

23. A system for determining the operating condition of a polyphase electrical motor system using at least one operating parameter of the motor, the system comprising:

a first sensor for sensing an instantaneous current signal supplied to the motor as a function of time for more than one electrical phase of the motor;

a second sensor for sensing an instantaneous voltage signal supplied to the motor as a function of time for more than one electrical phase of the motor;

means for amplitude demodulating the sensed current signals and the sensed voltage signals to provide an amplitude demodulated current signal as a function of time and an amplitude demodulated voltage signal as a function of time for the more than one electrical phases of the motor;

means for phase demodulating the sensed current signals and the sensed voltage signals to provide a phase demodulated current signal as a function of time and a phase demodulated voltage signal as a function of time for the more than one electrical phases of the motor; and means for calculating at least one electrical motor operating parameter as a function of time utilizing the amplitude demodulated current and voltage signals and the phase demodulated current and voltage signals, wherein the at least one electrical motor operating parameter is from the group consisting of: total real power, real power per phase, total reactive power, reactive power per phase, total apparent power, apparent power per phase, overall power factor, power factor per phase, electrical impedance per phase, and electrical balance.

24. An apparatus for determining at least one operating parameter for detecting the operating condition of a polyphase electrical motor system, the apparatus comprising:

a first sensor for sensing an instantaneous current signal supplied to the motor as a function of time for more than one electrical phase of the motor;

a second sensor for sensing an instantaneous voltage signal supplied to the motor as a function of time for more than one electrical phase of the motor;

means for amplitude demodulating the sensed current signals and the sensed voltage signals to provide an amplitude demodulated current signal as a function of time and an amplitude demodulated voltage signal as a function of time for the more than one electrical phase of the motor; and means for calculating at least one electrical motor operating parameter as a function of time utilizing the amplitude demodulated current and voltage signals, wherein the at least one electrical motor operating parameter is from the group consisting of: total apparent power, apparent power per phase, and electrical balance.

25. An apparatus for determining the power factor per phase for detecting the operating condition of a polyphase electrical motor system, the apparatus comprising:

a first sensor for sensing an instantaneous current signal supplied to the motor as a function of time for more than one electrical phase of the motor;

a second sensor for sensing an instantaneous voltage signal supplied to the motor as a function of time for more than one electrical phase of the motor;

means for phase demodulating the sensed current signals and the sensed voltage signals to provide a phase demodulated current signal as a function of time and a phase demodulated voltage signal as a function of time for the more than one electrical phase of the motor; and means for calculating the power factor per phase as a function of time utilizing the phase demodulated current and voltage signals.

* * * * *